(12) United States Patent
Moon

(10) Patent No.: US 8,907,670 B2
(45) Date of Patent: Dec. 9, 2014

(54) METERING DEVICE AND METERING METHOD

(71) Applicant: Samsung Electro-Mechanics Co., Ltd., Gyunggi-do (KR)

(72) Inventor: Yo Sub Moon, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 284 days.

(21) Appl. No.: 13/626,784

(22) Filed: Sep. 25, 2012

(65) Prior Publication Data

US 2013/0076351 A1   Mar. 28, 2013

(30) Foreign Application Priority Data

Sep. 26, 2011   (KR) ........................ 10-2011-0097060

(51) Int. Cl.
| | |
|---|---|
| *G01R 33/06* | (2006.01) |
| *G01R 7/00* | (2006.01) |
| *G01R 11/32* | (2006.01) |
| *G01R 33/07* | (2006.01) |
| *G01R 33/00* | (2006.01) |

(52) U.S. Cl.
CPC .......... *G01R 33/072* (2013.01); *G01R 33/0023* (2013.01)
USPC ........................................................ 324/251

(58) Field of Classification Search
USPC ............................................... 324/251, 142
See application file for complete search history.

(56) References Cited

U.S. PATENT DOCUMENTS

| | | | | |
|---|---|---|---|---|
| 4,884,021 A | * | 11/1989 | Hammond et al. | ........... 324/142 |
| 5,122,735 A | * | 6/1992 | Porter et al. | .................. 324/142 |
| 5,414,349 A | * | 5/1995 | Kobayashi | .................... 324/142 |

FOREIGN PATENT DOCUMENTS

| | | |
|---|---|---|
| JP | 2001-159646 | 6/2001 |
| KR | 1994-0024838 | 11/1994 |
| KR | 1996-008323 | 3/1996 |
| KR | 1020100043642 | 4/2010 |
| KR | 1020110066006 | 6/2011 |

\* cited by examiner

*Primary Examiner* — Reena Aurora
(74) *Attorney, Agent, or Firm* — Bracewell & Giuliani LLP; Brad Y. Chin

(57) ABSTRACT

Provided is a metering device and a metering method. The metering device includes a Hall sensor configured to output a Hall voltage generated by a magnetic field generated from a power supply line, an analog-digital converter configured to receive a voltage signal between a minimum voltage value and a maximum voltage value to convert the voltage signal into a digital signal and output the digital signal, an output adjustment unit connected between the Hall sensor and the analog-digital converter, and configured to attenuate and output the Hall voltage when the Hall voltage output from the Hall sensor is larger than the maximum voltage value and output adjustment information that adjusted the Hall voltage, and a control unit connected to the analog-digital converter and the output adjustment unit, and calculate the digital signal output from the analog-digital converter and the adjustment information output from the output adjustment unit to calculate wattage.

16 Claims, 2 Drawing Sheets

FIG. 1

METERING DEVICE AND METERING METHOD

CROSS-REFERENCE TO RELATED APPLICATIONS

This application claims the benefit of Korean Patent Application No. 10-2011-0097060 filed with the Korea Intellectual Property Office on Sep. 26, 2011, the disclosure of which is incorporated herein by reference.

BACKGROUND OF THE INVENTION

1. Field of the Invention

The present invention relates to a metering device and a metering method, and more particularly, to a metering device and a metering method, to which a Hall sensor is applied.

2. Description of the Related Art

A conventional watt-hour meter converts current flowing through a power supply line into an appropriate scale using a current transformer (CT) and a shunt resistor and provides it to an analog-digital converter (ADC). The ADC converts an analog signal into a digital signal to provide it to a control unit such as a main control unit (MCU), and the control unit such as the MCU calculates wattage.

However, miniaturization of the CT or the shunt resistor is limited and takes high costs, and thus, miniaturization and reduction in manufacturing costs of a watt-hour meter are limited.

In addition, since the CT cannot be easily implemented as a single chip together with the ACD, the MCU, and so on, it is impossible to manufacture the CT through a system on chip (SOC) method.

In order to overcome the limitation of the conventional watt-hour meter, techniques related to the watt-hour meter to which a Hall sensor is applied have been developed.

Here, the Hall sensor, which is a sensor configured to generate a voltage according to a magnetic field using Hall Effect, is widely used to detect a magnetic field in various fields.

A magnetic field is generated around a conductive wire through which current flows in a direction perpendicular to an electric field direction, and a magnitude of the magnetic field is varied in proportion to an intensity of the current. Applying this principle, variation in the magnetic field generated due to variation in current flowing through a power supply line is output as a voltage using the Hall sensor, and an amount of current flowing through the power supply line can be calculated using a voltage signal output from the Hall sensor.

As an example of the watt-hour meter to which the Hall sensor is applied, Patent Document 1 discloses an electronic watt-hour meter including a Hall sensor, a voltage/frequency conversion unit, a multiplication/integration unit, a calculation control unit, and a display unit.

In addition, Patent Document 2 discloses a digital relay including a constant current unit configured to uniformly maintain current flowing through a Hall magnetic sensor.

Meanwhile, a conventional analog-digital converter can convert an analog signal input within a certain range into a digital signal.

That is, a signal that can be processed by the analog-digital converter is limited.

However, since the Hall sensor outputs a voltage signal in proportion to a magnetic field, when the output voltage signal departs from a process range of the analog-digital converter, the wattage cannot be obtained. Patent Documents 1 and 2 also did not point out these problems and disclose means for solving these problems.

RELATED ART DOCUMENTS

Patent Documents

Patent Document 1: Korean Patent Laid-open Publication No.: 1996-0008323
Patent Document 2: Korean Patent Laid-open Publication No.: 1994-0024838

SUMMARY OF THE INVENTION

The present invention has been invented in order to overcome the above-described problems and it is, therefore, an object of the present invention to provide a metering device and a metering method capable of calculating wattage using a Hall sensor.

In accordance with one aspect of the present invention to achieve the object, there is provided a metering device including: a Hall sensor configured to output a Hall voltage generated by a magnetic field generated from a power supply line; an analog-digital converter configured to receive a voltage signal between a minimum voltage value and a maximum voltage value to convert the voltage signal into a digital signal and output the digital signal; an output adjustment unit connected between the Hall sensor and the analog-digital converter, and configured to attenuate and output the Hall voltage when the Hall voltage output from the Hall sensor is larger than the maximum voltage value and output adjustment information that adjusted the Hall voltage; and a control unit connected to the analog-digital converter and the output adjustment unit, and calculate the digital signal output from the analog-digital converter and the adjustment information output from the output adjustment unit to calculate wattage.

Here, the output adjustment unit may include a variable attenuator connected to the Hall sensor to receive and attenuate the Hall voltage to output the Hall voltage; and a gain control unit connected to the variable attenuator to generate an attenuation rate adjustment signal for increasing an attenuation rate of the variable attenuator when the voltage value output from the variable attenuator is larger than the maximum voltage value, providing the attenuation rate adjustment signal to the variable attenuator.

In addition, the gain control unit may include a monitoring unit configured to monitor the voltage value output from the variable attenuator; and a gain adjustment signal generating part configured to output the attenuation rate adjustment signal and the adjustment information according to information monitored by the monitoring unit.

Further, the metering device may further include a memory unit connected to the control unit to store the wattage calculated by the control unit, wherein the Hall sensor, the analog-digital converter, the output adjustment unit, the control unit and the memory unit are implemented on one chip.

Furthermore, the metering device may further include a display means connected to the control unit to display the wattage calculated by the control unit; and a display means control unit implemented on the chip and configured to control the display means.

In accordance with another aspect of the present invention to achieve the object, there is provided a metering device including: a Hall sensor configured to output a Hall voltage generated by a magnetic field generated from a power supply line; an analog-digital converter configured to receive a voltage signal between a minimum voltage value and a maximum voltage value to convert the voltage signal into a digital signal and output the digital signal; an output adjustment unit connected between the Hall sensor and the analog-digital converter, and configured to amplify and output the Hall voltage when the Hall voltage output from the Hall sensor is smaller than the minimum voltage value and output adjustment information that adjusted the Hall voltage; and a control unit connected to the analog-digital converter and the output adjustment unit, and calculate the digital signal output from the analog-digital converter and the adjustment information output from the output adjustment unit to calculate wattage.

Here, the output adjustment unit may include a variable gain amplifier connected to the Hall sensor to receive and amplify the Hall voltage to output the Hall voltage; and a gain control unit connected to the variable gain amplifier to generate a gain adjustment signal for increasing a gain of the variable gain amplifier when the voltage value output from the variable gain amplifier is smaller than the minimum voltage value, providing the gain adjustment signal to the variable gain amplifier.

In addition, the gain control unit may include a monitoring unit configured to monitor the voltage value output from the variable gain amplifier; and a gain adjustment signal generating part configured to output the gain adjustment signal and the adjustment information according to information monitored by the monitoring unit.

Further, the metering device may further include a memory unit connected to the control unit to store the wattage calculated by the control unit, wherein the Hall sensor, the analog-digital converter, the output adjustment unit, the control unit and the memory unit are implemented on one chip.

Furthermore, the metering device may further include a display means connected to the control unit to display the wattage calculated by the control unit; and a display means control unit implemented on the chip and configured to control the display means.

In accordance with still another aspect of the present invention to achieve the object, there is provided a metering device including a Hall sensor configured to output a Hall voltage generated by a magnetic field generated from a power supply line; an analog-digital converter configured to receive a voltage signal between a minimum voltage value and a maximum voltage value to convert the voltage signal into a digital signal and output the digital signal; an output adjustment unit connected between the Hall sensor and the analog-digital converter, and configured to attenuate and output the Hall voltage when the Hall voltage output from the Hall sensor is larger than the maximum voltage value, amplify and output the Hall voltage when the Hall voltage output from the Hall sensor is smaller than the minimum voltage value, and output adjustment information that adjusted the Hall voltage; and a control unit connected to the analog-digital converter and the output adjustment unit, and calculate the digital signal output from the analog-digital converter and the adjustment information output from the output adjustment unit to calculate wattage.

Here, the output adjustment unit may include a variable attenuator connected to the Hall sensor to receive and attenuate the Hall voltage to output the Hall voltage; a variable gain amplifier connected to the variable attenuator to receive and amplify the Hall voltage to output the Hall voltage; and a gain control unit connected to the variable attenuator and the variable gain amplifier to generate an attenuation rate adjustment signal for increasing an attenuation rate of the variable attenuator when the input voltage value is larger than the maximum voltage value to provide the attenuation rate adjustment signal to the variable attenuator, and generate a gain adjustment signal for increasing a gain of the variable gain amplifier when the input voltage value is smaller than the minimum voltage value to provide the gain adjustment signal to the variable gain amplifier.

In addition, the gain control unit may include a monitoring unit configured to monitor the voltage value output from the variable gain amplifier; and a gain adjustment signal generating part configured to output any one of the attenuation rate adjustment signal and the attenuation rate adjustment signal, and the adjustment information, according to information monitored by the monitoring unit.

Further, the metering device may further include a memory unit connected to the control unit to store the wattage calculated by the control unit, wherein the Hall sensor, the analog-digital converter, the output adjustment unit, the control unit and the memory unit are implemented on one chip.

Furthermore, the metering device may further include a display means connected to the control unit to display the wattage calculated by the control unit; and a display means control unit implemented on the chip and configured to control the display means.

In accordance with still another aspect of the present invention to achieve the object, there is provided a metering method using a metering apparatus including a Hall sensor, an analog-digital converter configured to receive a voltage signal between a minimum voltage value and a maximum voltage vale to convert the voltage signal into a digital signal to output the digital signal, an output adjustment unit, and a control unit, the method including: (A) providing a magnetic field generated from a power supply line to a Hall sensor and outputting a Hall voltage; (B) attenuating and outputting the Hall voltage when the Hall voltage is larger than the maximum voltage value, and amplifying and outputting the Hall voltage when the Hall voltage is smaller than the minimum voltage value; (C) converting the signal output in step (B) into a digital signal and outputting the digital signal; and (D) reflecting adjustment information that attenuated or amplified the Hall voltage in step (B) and calculating wattage as the digital signal output in step (C).

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
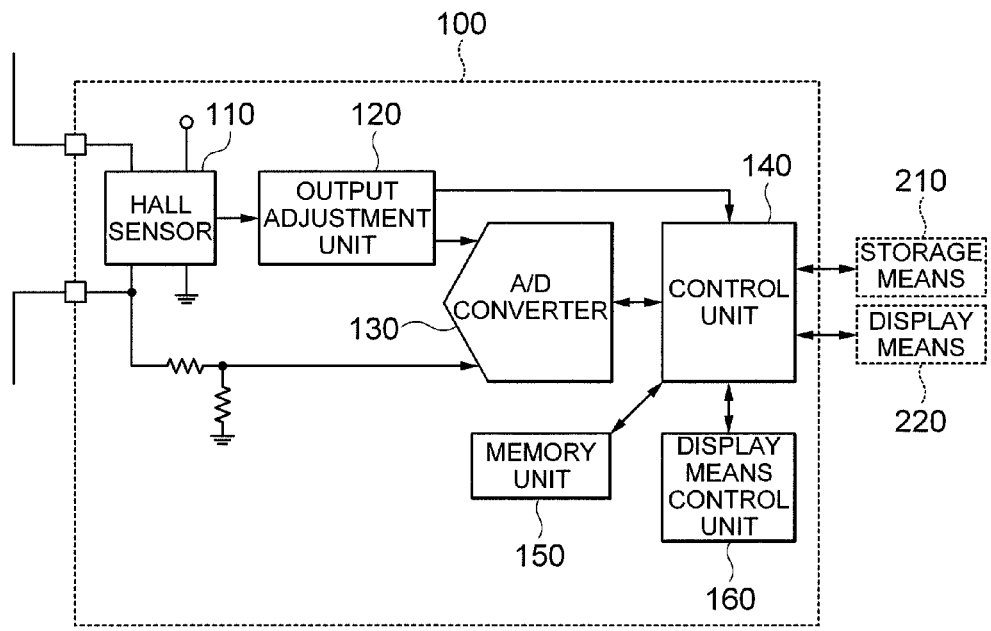
FIG. 1 is a schematic view showing a metering device in accordance with an exemplary embodiment of the present invention.

The following embodiments are provided as examples to fully convey the spirit of the invention to those skilled in the art. Therefore, the present invention should not be construed as limited to the embodiments set forth herein and may be embodied in different forms. And, the size and the thickness of an apparatus may be overdrawn in the drawings for the convenience of explanation. The same components are represented by the same reference numerals hereinafter.

Terms used herein are provided for explaining embodiments of the present invention, not limiting the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, motions, and/or devices, but do not preclude the presence or addition of one or more other components, motions, and/or devices thereof.

Hereinafter, configurations and effects of the present invention will be described in detail with reference to the accompanying drawings.

FIG. 1 is a schematic view of a metering device in accordance with an exemplary embodiment of the present invention.

Referring to FIG. 1, the metering device in accordance with an exemplary embodiment of the present invention may include a Hall sensor 110, an analog-digital converter 130, an output adjustment unit 120, and a control unit 140.

The Hall sensor 110 is disposed adjacent to a power supply line to generate a Hall voltage by Hall Effect due to a magnetic field generated from the power supply line, outputting the Hall voltage.

The analog-digital converter 130, which converts an analog signal into a digital signal, can convert a signal applied within a range between a minimum voltage value to a maximum voltage value, similar to the conventional analog-digital converter 130.

The output adjustment unit 120 is installed between the Hall sensor 110 and the analog-digital converter 130. When the Hall voltage output from the Hall sensor 110 departs from the range that can be processed by the analog-digital converter 130, the output adjustment unit 120 adjusts the Hall voltage to the range that can be processed by the analog-digital converter 130, and provides the adjusted information to the control unit 140 to reflect the information to wattage calculation.

The control unit 140 is connected to the analog-digital converter 130 and the output adjustment unit 120, and calculates the wattage using the signal output from the analog-digital converter 130, reflecting adjustment information output from the output adjustment unit 120.

Meanwhile, the control unit 140 includes a separate memory unit 150 to store data about the wattage calculated by the control unit 140.

Here, the Hall sensor 110, the analog-digital converter 130, the output adjustment unit 120, the control unit 140 and the memory unit 150 may be installed on one chip to implement what we call a system-on-chip type metering means 100.

In addition, a separate storage means 210 may be further installed outside the system-on-chip type metering means 100 to store information about wattage for a long time.

Accordingly, in comparison with the case in which the conventional current transformer and shunt resistor are used, the watt-hour meter can be remarkably miniaturized, power consumption in the watt-hour meter itself can be reduced, and manufacturing cost can also be reduced.

Meanwhile, the control unit 140 may further include a display means 220 such as LCD, LED, and so on, and a display means control unit 160 configured to control the display means 220 to display the wattage calculated by the metering means 100.

Figure 2:
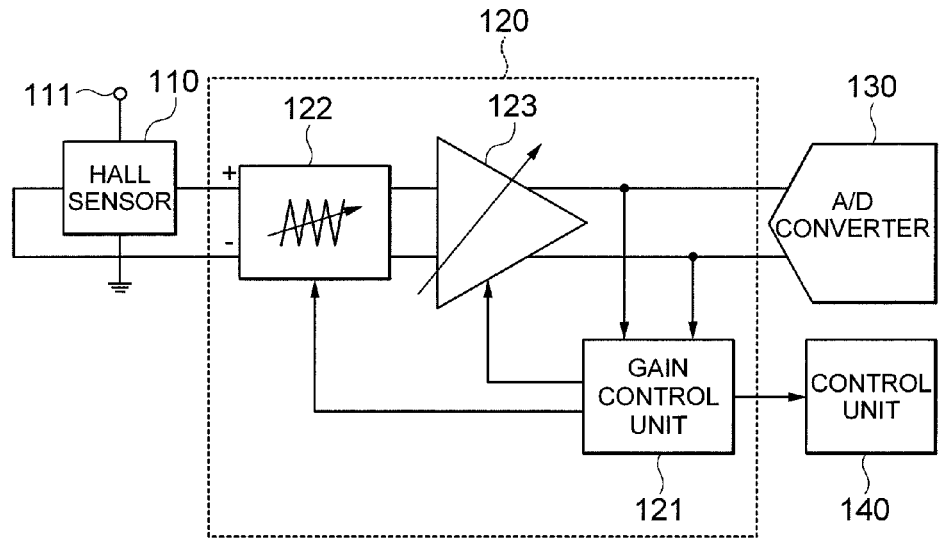
FIG. 2 is a schematic view showing major parts of the metering device in accordance with the exemplary embodiment of the present invention.
Figure 3:
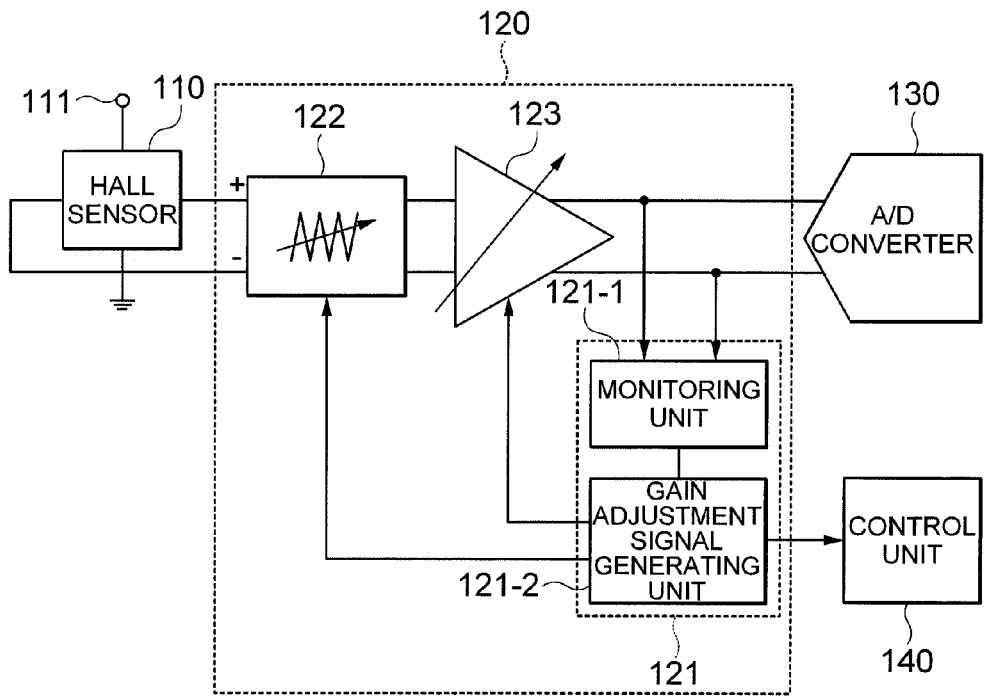
FIG. 3 is a schematic view showing major parts of the metering device in accordance with the exemplary embodiment of the present invention.
Figure 4:
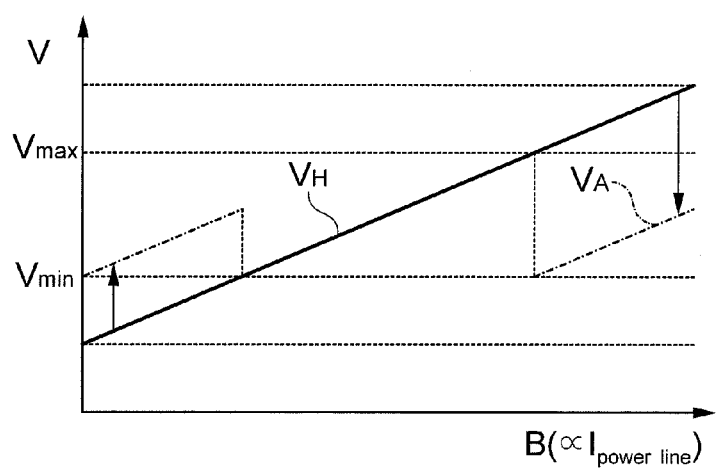
FIG. 4 is a graph for explaining relationship between a Hall voltage and an adjusted voltage in accordance with the exemplary embodiment of the present invention.

FIGS. 2 and 3 are schematic view showing major parts of the metering device in accordance with an exemplary embodiment of the present invention, and FIG. 4 is a graph for explaining relationship between a Hall voltage and an adjusted voltage in accordance with an exemplary embodiment of the present invention.

Referring to FIGS. 2 and 3, the output adjustment unit 120 may include a variable attenuator 122, a variable gain amplifier 123, and a gain control unit 121.

The variable attenuator 122 attenuates an input signal with a predetermined attenuation rate to output the signal.

The variable gain amplifier 123 amplifies the input signal with a predetermined gain.

The variable attenuator 122 and the variable gain amplifier 123 may be connected to an output terminal of the Hall sensor 110 to attenuate or amplify a Hall voltage signal. While the drawings illustrate the case in which the variable gain amplifier 123 is provided at a rear end of the variable attenuator 122, the present invention is not limited thereto.

The gain control unit 121 may include a monitoring unit 121-1 connected to output terminals of the variable attenuator 122 and the variable gain amplifier 123 to monitor whether a voltage signal provided to the analog-digital converter 130 corresponds a effective range between a minimum voltage value Vmin and a maximum voltage value Vmax that can be processed by the analog-digital converter 130, and a gain adjustment signal generating unit 121-2 configured to output a gain adjustment signal to amplify a monitored value when the monitored value is smaller than the minimum voltage vale and output an attenuation rate adjustment signal to attenuate the monitored value when the monitored value is larger than the maximum voltage value.

Referring to FIG. 4, the Hall sensor 110 generates a Hall voltage $V_H$ to output the Hall voltage according to an intensity of a magnetic field generated by current flowing through a power supply lime (not shown). When the Hall voltage $V_H$ output from the Hall sensor 110 is larger than the maximum voltage value Vmax that can be processed by the analog-digital converter 130 or smaller than the minimum value Vmin that can be processed by the analog-digital converter 130, the analog-digital converter 130 cannot normally process the Hall voltage, and thus, the wattage calculated by the control unit 140 becomes inaccurate.

In order to solve the problems, the metering device in accordance with an exemplary embodiment of the present invention amplifies the Hall voltage $V_H$ with a predetermined gain when the Hall voltage is smaller than the minimum voltage value Vmin to output the Hall voltage as a signal within a rage that can be processed by the analog-digital converter 130. Here, the amplified gain rate is provided to the control unit 140, and the control unit 140 calculates accurate wattage from the digital signal output from the analog-digital converter 130.

On the other hand, when the Hall voltage $V_H$ is larger than the maximum voltage value Vmax, the Hall voltage is attenuated with a predetermined attenuation rate, and the attenuation rate is provided to the control unit 140 such that the control unit 140 can accurately calculate the wattage.

Meanwhile, a metering method in accordance with an exemplary embodiment of the present invention may be implemented by adjusting a Hall voltage output from a Hall sensor 110 within a range of a signal that can be processed by an analog-digital converter 130 to provide the Hall voltage to the analog-digital converter 130, and converting the Hall voltage into a digital signal to calculate wattage, wherein adjustment information which adjusted the Hall voltage is reflected to calculate the wattage.

Accordingly, a compact and low power consumption metering device and metering method can be implemented with a low cost.

Embodiments of the invention have been discussed above with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention.

As can be seen from the foregoing, according to the metering device and the metering method in accordance with an exemplary embodiment of the present invention, in comparison with the conventional watt-hour meter using the current transformer and shunt resistor are used, the watt-hour meter can be remarkably miniaturized, power consumption in the watt-hour meter itself can be reduced, and manufacturing cost can also be reduced.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A metering device comprising:
   a Hall sensor configured to output a Hall voltage generated by a magnetic field generated from a power supply line;
   an analog-digital converter configured to receive a voltage signal between a minimum voltage value and a maximum voltage value to convert the voltage signal into a digital signal and output the digital signal;
   an output adjustment unit connected between the Hall sensor and the analog-digital converter, and configured to attenuate and output the Hall voltage when the Hall voltage output from the Hall sensor is larger than the maximum voltage value and output adjustment information that adjusted the Hall voltage; and
   a control unit connected to the analog-digital converter and the output adjustment unit, and calculate the digital signal output from the analog-digital converter and the adjustment information output from the output adjustment unit to calculate wattage.

2. The metering device according to claim 1, wherein the output adjustment unit comprises:
   a variable attenuator connected to the Hall sensor to receive and attenuate the Hall voltage to output the Hall voltage; and
   a gain control unit connected to the variable attenuator to generate an attenuation rate adjustment signal for increasing an attenuation rate of the variable attenuator when the voltage value output from the variable attenuator is larger than the maximum voltage value, providing the attenuation rate adjustment signal to the variable attenuator.

3. The metering device according to claim 2, wherein the gain control unit comprises:
   a monitoring unit configured to monitor the voltage value output from the variable attenuator; and
   a gain adjustment signal generating part configured to output the attenuation rate adjustment signal and the adjustment information according to information monitored by the monitoring unit.

4. The metering device according to claim 1, further comprising a memory unit connected to the control unit to store the wattage calculated by the control unit, wherein the Hall sensor, the analog-digital converter, the output adjustment unit, the control unit and the memory unit are implemented on one chip.

5. The metering device according to claim 4, further comprising:
   a display means connected to the control unit to display the wattage calculated by the control unit; and
   a display means control unit implemented on the chip and configured to control the display means.

6. A metering device comprising:
   a Hall sensor configured to output a Hall voltage generated by a magnetic field generated from a power supply line;
   an analog-digital converter configured to receive a voltage signal between a minimum voltage value and a maximum voltage value to convert the voltage signal into a digital signal and output the digital signal;
   an output adjustment unit connected between the Hall sensor and the analog-digital converter, and configured to amplify and output the Hall voltage when the Hall voltage output from the Hall sensor is smaller than the minimum voltage value and output adjustment information that adjusted the Hall voltage; and
   a control unit connected to the analog-digital converter and the output adjustment unit, and calculate the digital signal output from the analog-digital converter and the adjustment information output from the output adjustment unit to calculate wattage.

7. The metering device according to claim 6, wherein the output adjustment unit comprises:
   a variable gain amplifier connected to the Hall sensor to receive and amplify the Hall voltage to output the Hall voltage; and
   a gain control unit connected to the variable gain amplifier to generate a gain adjustment signal for increasing a gain of the variable gain amplifier when the voltage value output from the variable gain amplifier is smaller than the minimum voltage value, providing the gain adjustment signal to the variable gain amplifier.

8. The metering device according to claim 7, wherein the gain control unit comprises:
   a monitoring unit configured to monitor the voltage value output from the variable gain amplifier; and
   a gain adjustment signal generating part configured to output the gain adjustment signal and the adjustment information according to information monitored by the monitoring unit.

9. The metering device according to claim 6, further comprising a memory unit connected to the control unit to store the wattage calculated by the control unit, wherein the Hall sensor, the analog-digital converter, the output adjustment unit, the control unit and the memory unit are implemented on one chip.

10. The metering device according to claim 9, further comprising:
    a display means connected to the control unit to display the wattage calculated by the control unit; and
    a display means control unit implemented on the chip and configured to control the display means.

11. A metering device comprising:
- a Hall sensor configured to output a Hall voltage generated by a magnetic field generated from a power supply line;
- an analog-digital converter configured to receive a voltage signal between a minimum voltage value and a maximum voltage value to convert the voltage signal into a digital signal and output the digital signal;
- an output adjustment unit connected between the Hall sensor and the analog-digital converter, and configured to attenuate and output the Hall voltage when the Hall voltage output from the Hall sensor is larger than the maximum voltage value, amplify and output the Hall voltage when the Hall voltage output from the Hall sensor is smaller than the minimum voltage value, and output adjustment information that adjusted the Hall voltage; and
- a control unit connected to the analog-digital converter and the output adjustment unit, and calculate the digital signal output from the analog-digital converter and the adjustment information output from the output adjustment unit to calculate wattage.

12. The metering device according to claim 11, wherein the output adjustment unit comprises:
- a variable attenuator connected to the Hall sensor to receive and attenuate the Hall voltage to output the Hall voltage;
- a variable gain amplifier connected to the variable attenuator to receive and amplify the Hall voltage to output the Hall voltage; and
- a gain control unit connected to the variable attenuator and the variable gain amplifier to generate an attenuation rate adjustment signal for increasing an attenuation rate of the variable attenuator when the input voltage value is larger than the maximum voltage value to provide the attenuation rate adjustment signal to the variable attenuator, and generate a gain adjustment signal for increasing a gain of the variable gain amplifier when the input voltage value is smaller than the minimum voltage value to provide the gain adjustment signal to the variable gain amplifier.

13. The metering device according to claim 12, wherein the gain control unit comprises:
- a monitoring unit configured to monitor the voltage value output from the variable gain amplifier; and
- a gain adjustment signal generating part configured to output any one of the attenuation rate adjustment signal and the attenuation rate adjustment signal, and the adjustment information, according to information monitored by the monitoring unit.

14. The metering device according to claim 11, further comprising a memory unit connected to the control unit to store the wattage calculated by the control unit, wherein the Hall sensor, the analog-digital converter, the output adjustment unit, the control unit and the memory unit are implemented on one chip.

15. The metering device according to claim 14, further comprising:
- a display means connected to the control unit to display the wattage calculated by the control unit; and
- a display means control unit implemented on the chip and configured to control the display means.

16. A metering method using a metering apparatus comprising a Hall sensor, an analog-digital converter configured to receive a voltage signal between a minimum voltage value and a maximum voltage vale to convert the voltage signal into a digital signal to output the digital signal, an output adjustment unit, and a control unit, the method comprising:
- (A) providing a magnetic field generated from a power supply line to a Hall sensor and outputting a Hall voltage;
- (B) attenuating and outputting the Hall voltage when the Hall voltage is larger than the maximum voltage value, and amplifying and outputting the Hall voltage when the Hall voltage is smaller than the minimum voltage value;
- (C) converting the signal output in step (B) into a digital signal and outputting the digital signal; and
- (D) reflecting adjustment information that attenuated or amplified the Hall voltage in step (B) and calculating wattage as the digital signal output in step (C).

* * * * *